(12) United States Patent
Kitazume et al.

(10) Patent No.: US 6,417,034 B2
(45) Date of Patent: Jul. 9, 2002

(54) MANUFACTURING METHOD FOR ORGANIC EL DEVICE

(75) Inventors: Eiichi Kitazume; Kazuhiro Mizutani, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/843,758

(22) Filed: Apr. 30, 2001

(30) Foreign Application Priority Data

May 1, 2000 (JP) ......................................... 2000-132762

(51) Int. Cl.[7] .............................................. H01L 21/00
(52) U.S. Cl. .......................... 438/160; 438/26; 438/28; 438/29; 438/99; 313/458; 313/505; 313/506
(58) Field of Search ............................ 438/160, 26, 29, 438/99, 28; 313/458, 505, 506

(56) References Cited

U.S. PATENT DOCUMENTS

| | | | |
|---|---|---|---|
| 6,136,622 A | * 10/2000 | Fukuzawa et al. | 438/26 |
| 6,165,543 A | * 12/2000 | Otsuki et al. | 427/66 |
| 6,294,892 B1 | * 9/2001 | Utsugi et al. | 318/640 |
| 2001/0001050 A1 | * 5/2001 | Miyashita et al. | 428/690 |

FOREIGN PATENT DOCUMENTS

| | | |
|---|---|---|
| JP | 11-195485 | 7/1999 |
| JP | 11-204267 | 7/1999 |
| JP | 11-307242 | 11/1999 |

* cited by examiner

Primary Examiner—Richard Elms
Assistant Examiner—Pho M. Luu
(74) Attorney, Agent, or Firm—McGinn & Gibb, PLLC

(57) ABSTRACT

A method for manufacturing an organic EL display device is provided, capable of improving an opening ratio and providing narrower pitches for narrowing non-lighting portion between pixels, and, at the same time, capable of eliminating short-circuiting between display pixels for eliminating cross-talk and non-lighting pixels. In the deposition process of the cathode 6, the incident angle of the deposition material onto the substrate is optimized by optionally changing parameters such as a distance between the substrate 1 and the mask 11 and a distance between the substrate and the point deposition source 13. Thus, deposition material from a plurality of deposition sources impinges onto the substrate surface obliquely passing at a different incident angles though opening (slits 11a) of the mask 11, so that the width 10 of the electrode pattern 6 becomes broader than the width of the slit by superposition of the deposition material passing through the slits at different incident angles.

11 Claims, 6 Drawing Sheets

MANUFACTURING METHOD FOR ORGANIC EL DEVICE

BACKGROUND OF THE INVENTION

1. Field of the Invention

The present invention relates to a manufacturing method for organic EL devices used as display devices for computers and televisions or the like.

2. Background Art

EL (Electro-Luminescence) elements, which use organic materials as the luminescent materials are called organic EL elements, and the organic EL display devices using the organic EL elements have favorable features such as:

(1) high light emitting efficiency,
(2) low driving voltage,
(3) capability of displaying multiple colors,
(4) no need to use a back light because of its spontaneous emission of light,
(5) no dependency on angle of visibility,
(6) thin and light,
(7) high response speed,
(8) capability of using a flexible substrate.

Organic EL devices have therefore been drawing attention because they could take place of LCD (liquid crystal display) devices.

FIG. 9 shows a perspective view showing a schematic structure of an organic EL display device in the simple matrix system. On the surface of a transparent glass substrate 1 (substrate), a transparent anode 2 patterned in a plurality of stripes is formed, and on the anode 2, an organic positive hole transporting layer 3, an organic luminescent layer 4, an organic electron transporting layer 5 are formed.

The organic EL display device further comprises a cathode 6 patterned in a plurality of stripes so as to perpendicularly cross the above-described anode 2.

The anode 2 is formed, by first depositing an ITO (Indium Tin Oxide) film by a sputtering method or the like, and then by etching this ITO film for patterning a plurality of stripes formed in parallel to each other.

After depositing the organic film 7 onto the anode 2 by a vacuum deposition method such as a resistance heating method, the cathode 6 is formed by vacuum deposition methods such as a resistance heating deposition method, an electron beam deposition method, or by a sputtering method using a shadow masks for disposing a plurality of stripes in parallel to each other.

Alternatively, before formation of the anode 6, an electron injection layer made of an inorganic thin film such as an inorganic fluoride is first formed by vacuum deposition methods such as resistance heating, electron beam deposition, or by a sputtering method.

The above described anode 2 and cathode 6 are formed so as to perpendicularly cross each other.

The cathode 6 is usually formed using materials such as aluminum (Al), an alloy of magnesium and silver (Mg—Ag), an alloy of aluminum and lithium (Al—Li), or an alloy of magnesium and indium (Mg—In).

A deposition process of the thin film using the resistance heating method is usually applied to the formation of the cathode 6.

In this deposition process, deposition is executed by filling the above described deposition material into a deposition source, which is formed by processing high melting point metals such as tungsten, tantalum, or molybdenum, and by placing below the substrate 1 the deposition source filled with the deposition material. The deposition source is heated up to a predetermined temperature by flowing an electric current to the source and the material to be deposited is evaporated and deposited onto the substrate surface. In general, the deposition source has been placed directly below the center of the horizontally held substrate aiming to form the film in a uniform thickness or at a position, which is not directly below the center of the substrate but somewhere below the deposition region of the substrate because of the geometrical restriction of the deposition reactor.

When, for example, the shadow mask method is used for patterning the stripe shaped cathode 6, the shadow mask is formed using a thin metal plate by etching it for forming a plurality of stripes and the metal plate after being processed is closely attached to the substrate for further deposition process.

As described above, when the cathode 6 is deposited by placing the deposition source beneath the substrate as described above, in order to improve the opening ratio of the light emitting of cross sections between the cathode 6 and the anode 2, it becomes necessary to make the opening area of the metal mask wider by narrowing the metal stripe-like portions between the openings (slits).

Generally, the metal mask can be processed by various methods such as a laser processing method, an additive processing (electroforming) method, and a wet etching processing method. However, it is difficult for any of the above-mentioned methods to process a narrow space less than 0.1 mm.

Since the stripe-like portions between slits are mechanically weak, it is difficult to form a mask having such narrow metal stripes, due to deformation or breakage of the metal stripe-like portions.

A counter measure is disclosed in Japanese Unexamined Patent Application, First Publication No. Hei 10-50478, in which a reinforcing line is attached to the mask for preventing the deformation of the mask.

However, in conventional cathode forming methods, in order to obtain a desired pattern width of the cathode 6, it is necessary for the stripe-like metal portions between slits of the mask to have the same pattern width of the cathode 6, and as a result, the manufacturing process becomes complicated.

In contrast, when a mask for general use is used, it is not possible to make slit widths between cathode stripes of 0.1 mm or less, since it is not possible to form the original slit width of the mask to be less than 0.1 mm, and since it is not possible to make the slit width finer from the relative positional relationship between the substrate 1, the mask, and the deposition source. Thus, the problem of the conventional methods is that it is not possible to make the slit widths less than 0.1 mm.

When forming the organic films, which constitute lower layers of the cathode, the evaporated substances or the deposition materials perpendicularly impinge onto the organic film located around the center portion of the substrate beyond the deposition source. Thereby, the kinetic energy of the deposition materials or depositing atoms impinging on the organic films sometimes causes a local deformation or coagulation of the organic film and pin-holes are often generated in the organic films by the surface disorder or the change of the surface morphology of the organic films.

In addition, particles of the deposition materials (cluster) generated by the bumping of the deposition material in the deposition source impinge the organic film perpendicularly, which damages the organic film. Damage of the organic film by this phenomenon is particularly remarkable when the deposition material is oxidized or nitridized by the reactions with oxygen or nitrogen in air.

When the cathode 6 is formed on the thus-degraded organic films, the organic materials do not exhibit normal rectification characteristics due to a local field concentration by the disorder of the organic film or due to a short circuit by the pin-holes formed in the surface of the organic material.

An influence of the conventional cathode formation method on the operational characteristics of the conventional organic El display device is described with reference to FIG. 10 when being operated by a simple matrix driving method. FIG. 10 is a block diagram showing the structure of the organic EL display having a 6×6 simple matrix structure.

When driving an organic EL display device having a simple matrix structure shown in FIG. 10 in a line sequential driving mode, the anode, assigned as the data electrode, is connected to a current source or a voltage source for applying a voltage which changes with data, and the cathode, assigned as the scanning electrode, is sequentially scanned at timings shown in FIG. 11.

At the time A shown in FIG. 11, when the scanning electrode S2 is turned into a LOW level (voltage is 0), an organic El element at an intersection between the data electrode I1 and an electric potential V1 is energized so that a current flows in the forward direction and the organic EL element emits light.

In contrast, when, for example, the intersection between the data electrode I3 and the scanning electrode S4 is short-circuited and the leak current flows in the reverse direction, the light emission region located at the intersection between the data electrode I3 and the scanning electrode S4 always becomes the non-lighting state.

As a result, at a time B in FIG. 11, since the potential between the scanning electrode S3 and the scanning electrode S4 is zero, the light emitting region (organic EL elements) in the display area except for a short-circuited region is energized in the forward direction and an electric current flows in the direction indicated by the arrow 9.

It becomes impossible to control the current to be supplied from the data driver to the lighting region at the time of selecting pixels when some organic EL elements are short-circuited.

Therefore, when the scanning electrode is turned on the LOW state according to the timing chart shown in FIG. 11, an extraordinary current will flow in the pixels except for the short-circuited pixel on the same data electrode I3 as that of the short-circuited organic EL element due to the potential difference of the scanning electrode S4.

As a result, during driving of the organic EL elements, pixels on the longitudinal line along the data electrode I3 are usually lit. As described above, the short-circuit of some organic EL elements cause non-lighting pixels or cross-talk.

SUMMARY OF THE INVENTION

The present invention is made to overcome those above-described problems and an object of the present invention is to provide a manufacturing method for an organic EL display device, capable of increasing the opening area of the display and making the pitch narrower so as to make the non-lighting space between pixels narrower.

An additional object of the present invention is also to provide a manufacturing method for an organic EL display device, capable of eliminating generation of short-circuited pixels in the organic El elements and to prevent generation of non-lighting defective pixels and cross-talk.

According to the first aspect of the present invention, an organic EL display device manufacturing method comprises: a first step of forming a first stripe-shaped electrode pattern on a substrate surface; a second step of forming a plurality of layers including an organic layer on the substrate surface including the first electrode pattern; and a third step of forming a second stripe-shaped electrode pattern on the first electrode pattern in the orthogonal direction to the first electrode pattern by disposing a mask between deposition sources of the electrode material and the substrate separated by a predetermined distance from the substrate and by supplying a deposition material onto the surface of the plurality of layers through slits of the mask; wherein, the deposition sources are provided at a position such that the deposition material is deposited onto the substrate surface at a predetermined incident angle.

According to the second aspect, in the above organic EL display device manufacturing method, a second deposition source is disposed at a position on a projected line at the position of the first deposition source in parallel with stripes of said second stripe-like electrode and which has the same distance as the first deposition source from the vertical line passing through the center of the substrate.

According to the third aspect, the organic EL display device manufacturing method further comprises: after the third step, a fourth step of rotating the substrate and the mask by 180 degrees about the vertical axis passing the center of the substrate, while maintaining a positional relationship between the substrate and mask; and a fifth step of forming the second electrode pattern in succession to the third step by supplying a deposition material for the electrode through slits of the mask.

According to the fourth aspect, in the organic EL display device manufacturing method according to claim 1, the incident angle of the deposition material onto the substrate is controlled by controlling a distance between the substrate and a plane which is parallel to the substrate, and which includes apertures of the deposition sources, and a distance between a projected point of the substrate center on the plane including apertures of the deposition sources and centers of the deposition sources.

According to the fifth aspect, in the organic EL display device manufacturing method according to claim 1, the substrate is disposed in the inclined state with a predetermined inclination angle from the horizontal plane, and the mask is disposed parallel to the substrate separated at a predetermined distance from said substrate.

According to the sixth aspect, in the organic EL display device manufacturing method according to claim 1, the incident angle of the deposition material onto the substrate surface is set within a range of 30 to 85 degrees.

DETAILED DESCRIPTION OF THE INVENTION

Hereinafter, the present invention is described with reference to the attached organic EL device of the present invention.

Figure 1:
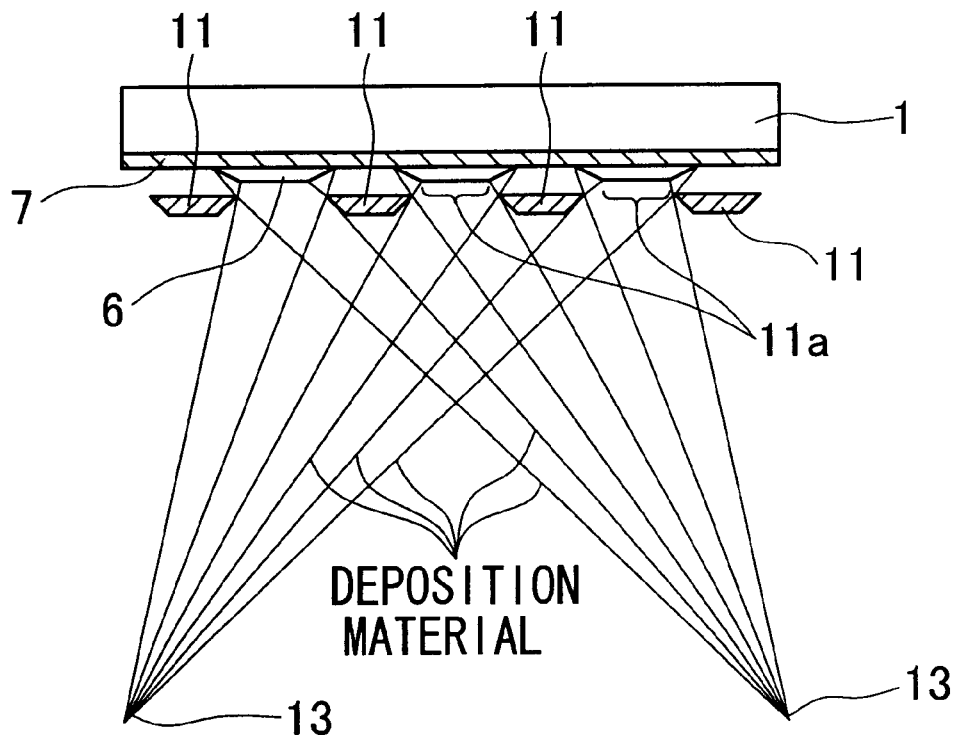
FIG. 1 is a conceptual diagram showing the manufacturing method of an organic EL display device of the present invention.

According to the manufacturing method of the present invention, as shown in FIG. 1, for example, an incident angle of the deposition material onto the surface of the substrate 1 is optionally determined by optimizing parameters such as the distance between the substrate 1 and the mask 11 and the distance between the substrate 1 and the point deposition sources (resistance heat deposition sources) 13. These point deposition sources 13 supply the same deposition material (for example, the electrode material), respectively.

Figure 3:
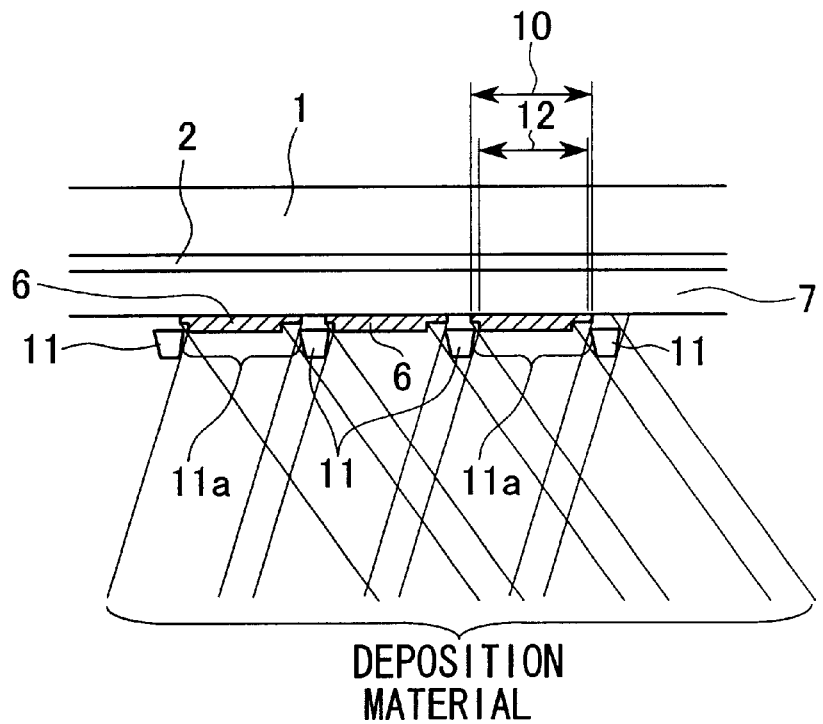
FIG. 3 is a cross sectional view of the organic EL display device showing the layer structure of the organic EL display device of the present invention.
Figure 4:
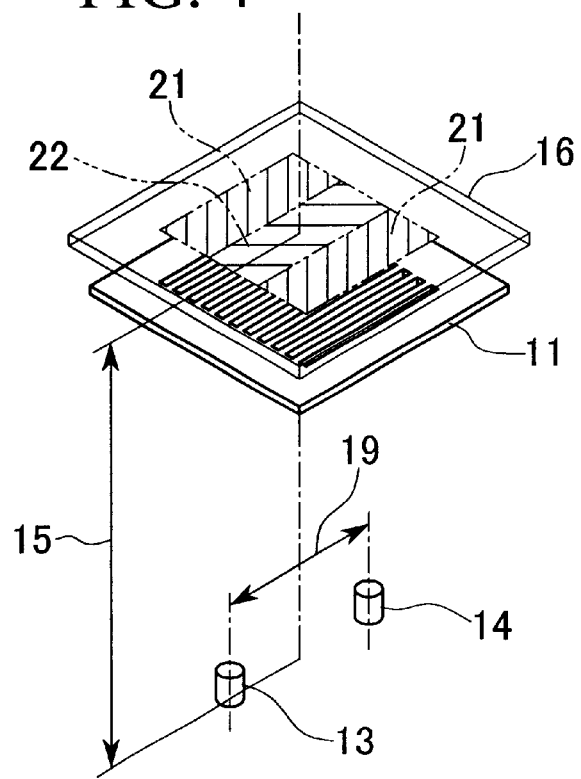
FIG. 4 is a schematic diagram showing an arrangement of the substrate and deposition sources in the vacuum deposition chamber in the conventional organic EL display device manufacturing process according to Example 1 of conventional methods.

Consequently, as shown in FIG. 3, the deposition materials from a plurality of deposition sources 13 (FIG. 1) impinge to the surface of the substrate 1 and are deposited while obliquely passing the slits 11a of the mask 11. Thus, the deposition materials from a plurality of deposition sources are respectively displaced and overlapped, so that the width of the electrode stripe pattern 6 becomes thicker than the width 12 of the slit widths of the mask 11.

That is, the spaces between the electrode patterns 6 can be formed thinner than the width 10 of the electrode pattern (cathode) 6.

The method described above makes it possible to form thinner spaces between respective electrode patterns 6 less than 0.1 mm, which was not obtainable in the conventional method using the shadow mask, which results in producing a display device having an expanded light emitting region (the width of the cathode 6), that is, having a large aperture.

In addition, as shown in FIG. 1, when forming the electrode pattern in the present manufacturing process of the organic El display device, the energy of deposition particle materials such as metal atoms or molecules reaching the substrate 1 is dispersed in the parallel direction with respect to the surface of the organic film 7, because of dispersed incident angles of the deposition particles.

As a result, the vertical component of the impinging energy of the particles incident on the organic film 7 is reduced and the damage of the backing organic film 7 can be avoided.

In addition, during deposition, bumping of the deposition material occurs in the vertical direction towards positions which are different from the impinging position of the deposition material, so that the atoms, molecules, or particles of the deposition material will impinge at a position differing from that of the bumping material, which results in preventing generation of pin holes by the normal deposition materials.

However, it is not preferable to adopt a lower incident angle of less than 30 degrees for evaporating the metallic material, since if the incident angle is low, non-uniform film thickness is incurred, and the deposition apparatus becomes large, and the pitch of the deposition pattern may not be accurately arranged.

In the above manufacturing process, if the depositing region in the substrate surface satisfies the above-described conditions, deposition of the cathode 6 can be performed while rotating the substrate 1.

Furthermore, when the deposition of the cathode material is made by a single deposition source first on the substrate held at a certain horizontal position, and then secondly on the substrate which is rotated 180 degrees horizontally from the first position, it is possible to obtain the same results as those when deposited by a plurality of deposition sources by superimposing the diffracted deposition particles.

In addition, the manufacturing method of the organic EL device by the present invention can be also applied to deposition of the anode film, when forming the organic EL device by first forming the cathode 6 and then depositing the anode 2 after forming the organic film 7.

Below, some embodiments of the manufacturing method for the organic EL display devices are provided.

First Embodiment

Figure 2:
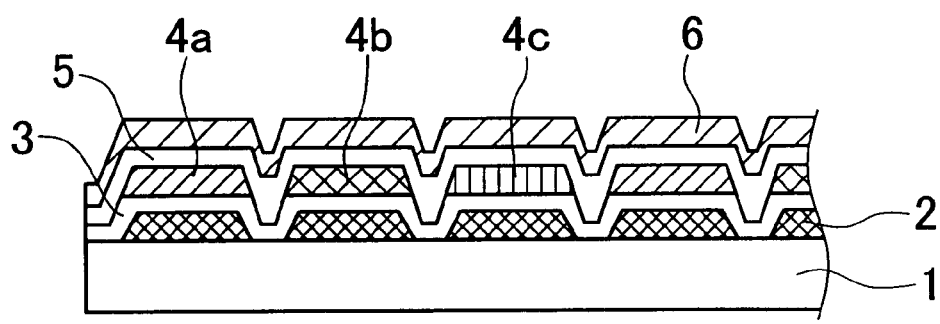
FIG. 2 is a cross-sectional view of the organic EL display device manufactured by the method shown in FIG. 1.

The manufacturing method of the organic EL display device according to the first embodiment of the present invention is described with reference to FIG. 2. FIG. 2 is a cross-sectional view of the organic EL display device produced by the manufacturing method for the organic EL display device according to the first embodiment.

A 1.1 mm-thick glass plate, (code number is No. 1737, made by Corning Glass Works), is used as the substrate (glass substrate), and a 100 nm-thick ITO (indium-tin oxide) film is deposited as the anode 2 onto the substrate surface for obtaining a substrate 1 with the anode 2 of the ITO electrode film.

The ITO transparent electrode film deposited onto the substrate 1 is subjected to a photolithography and etching process for forming the anode 2 composed of a plurality of stripes, having a stripe width of 0.1 mm and a pitch of 0.15 mm.

Subsequently, after forming the anode 2 having a plurality of stripes, the surface of the substrate 1 is rinsed with an organic solvent and then subjected to a UV (ultraviolet light)/ozone cleaning.

Subsequently, an organic film as a positive hole-transporting layer 3 is formed on the substrate 1. That is, a crucible in a vapor deposition reactor is filled with an organic compound N,N'-diphenyl N,N'bis(α-naphtyl)-1,1'- biphenyl-4,4' diamine (hereininafter, called α-NPD) and the organic compound is deposited onto the ITO electrode 2 after evacuating the reactor to less than $1 \times 10^{-5}$ Torr (=$7.5 \times 10^{-8}$ Pa).

After the positive-hole transporting layer 3 is formed, three organic color film layers composed of a red luminous layer 4a, a green luminous layer 4b, and blue luminous layer 4c are formed in parallel to each other on the stripes of the ITO electrode 2, using a mask (not shown) having a stripe pattern comprised of a plurality of 0.1 mm-thick slits and a pitch having a pitch width of three times than that of the positive hole transporting film 3. The three organic color film layers composed of a red luminous layer 4a, a green luminous layer 4b, and blue luminous layer 4c are formed so as to perpendicularly cross the stripes of the ITO electrode 2.

The red luminous layer is deposited into a 50 nm-thick predetermined film pattern by using tris (8-qinolylite) almiuium complex (hereinafter, called Alq3) with a dopant of 4-dicyanomethylene-2-methyl-6-(p-dimethylaminostyryl)-4H-pyran (DCM, doping concentration of 5 wt %).

Subsequently, after displacing the mask by the pitch of the ITO electrode 2, the green luminous layer 4b is formed into a 50 nm-thick predetermined film pattern by using Alq3 with a dopant of quinacridone (the doping concentration of 5 wt %).

Subsequently, after displacing the mask further by the pitch of the ITO electrode 2, the blue luminous layer 4c is formed into a 50 nm-thick predetermined film pattern by using perylene.

The three organic color film layers of a red luminous layer 4a, a green luminous layer 4b, and blue luminous layer 4c are formed by the above-described process.

Subsequently, an organic film made of Alq3, corresponding to an electron transporting layer 5, is deposited in a thickness of 50 nm.

It is noted that the above thin film formation is carried out consistently in a vacuum.

Figure 5:
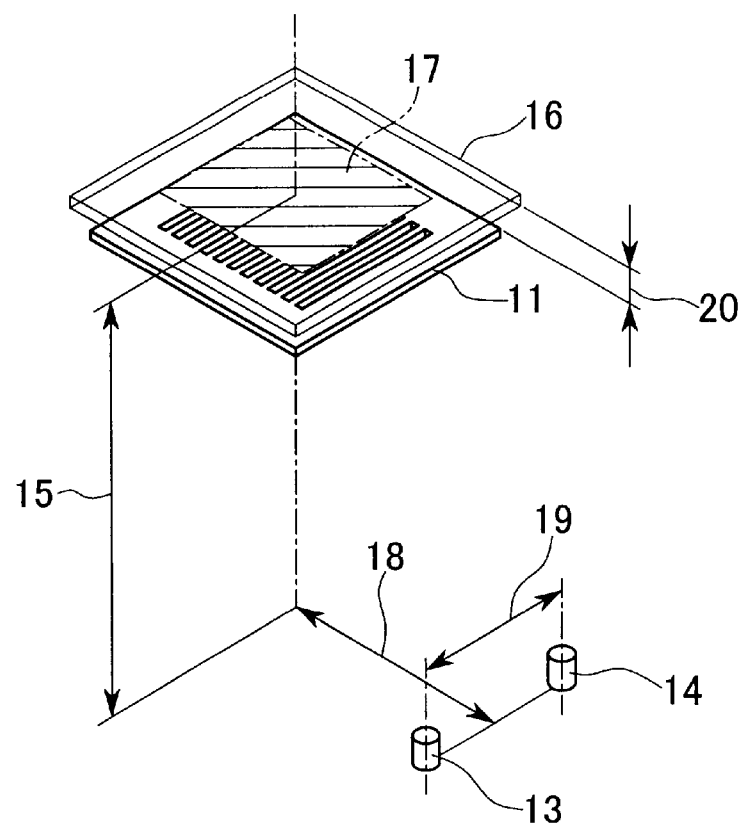
FIG. 5 is a schematic diagram showing an arrangement of the substrate and deposition sources in the vacuum deposition chamber in the organic EL display device manufacturing process according to the first embodiment of the present invention.

Subsequently, as shown in FIG. 5, the cathode 6 made of an alloy of aluminum and lithium is formed by a dual simultaneous deposition method. For carrying out this dual spontaneous deposition, aluminum is filled in a first resistance heating deposition source 13 and lithium is filled in a second resistance heating deposition source 14.

These resistance heating deposition sources 13 and 14 are disposed such that the height (distance) 15 between the deposition surface 16 and the aperture surface of the resistance heating deposition sources (the top surfaces of the deposition source including the aperture portion parallel to the surface 16 to be deposited) agrees to 400 mm.

The shape of the resistance heating deposition sources is cylindrical, having an aperture diameter of 20 mm and a height of 20 mm. Two resistant heating deposition sources 13 and 14 are disposed in the horizontal plane parallel to the ITO electrode 2 in which at a distance 18 from the center of the substrate to the line connecting two deposition sources 13 and 14 is 190 mm (the distance 18 between the center of the substrate in parallel to the ITO electrode 2 to the line connecting the centers of both first and second deposition sources 13 and 14). Two deposition sources 13 and 14 are separated at a distance 19 of 100 mm.

When the incident angle of the deposition particle to the substrate is obtained by calculating the incident angles from the deposition source 13 to the region 17 on the substrate 16, the incident angles are in a range from the maximum angle of 76 degrees to the minimum angle of 55 degrees.

Subsequently, in order to form the cathode 6, the substrate 16, after forming to the electron transporting layer 5, is carried into a vacuum deposition reactor. A stainless steel plate (SUS 304) is used for the mask 11 for forming the cathode pattern and a plurality of slits 11a in a width of 0.4 mm is formed separated by each pitch of 0.5 mm.

Then, the mask 11 and the substrate 16 are horizontally placed in the vacuum deposition reactor holding a gap of 0.05 mm such that both the mask 11 and the substrate 16 do not contact. The pattern width of the cathode 6 can be adjusted by controlling the incident angle of the deposition material and the gap between the mask 11 and the substrate 16.

The cathode pattern is deposited using an alloy of aluminum and lithium at a compositional ratio of 10:1 in a thickness of 200 nm.

Figure 11:
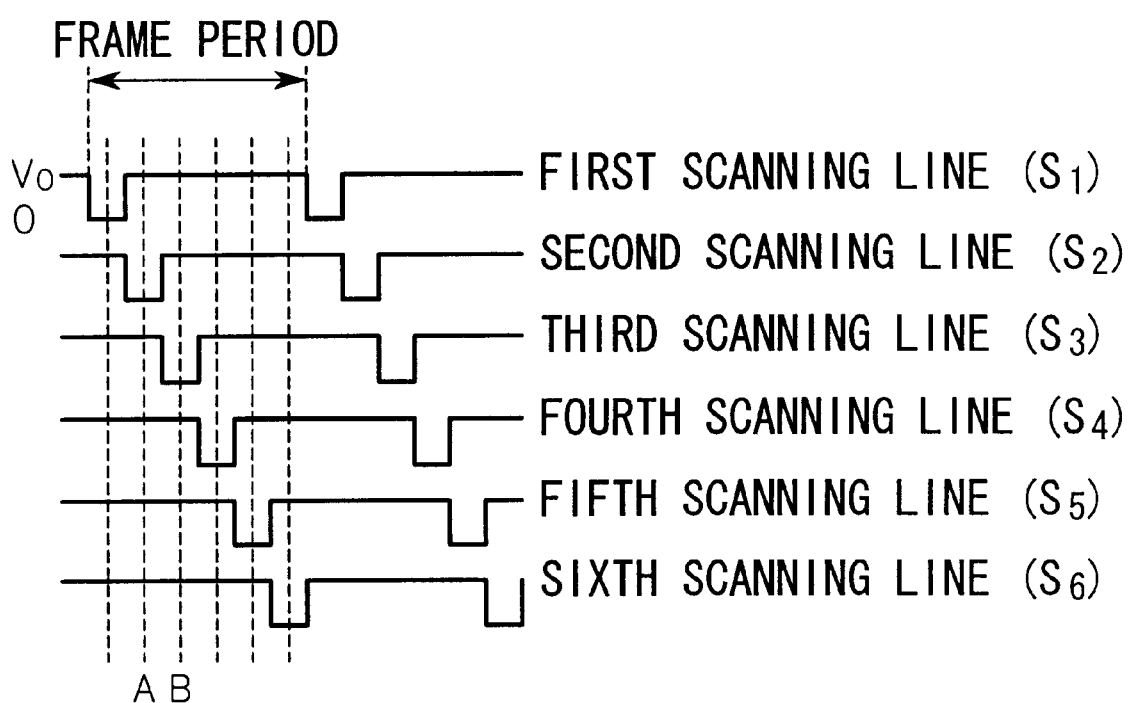
FIG. 11 is a timing chart of the scanning signals at the time of driving the simple matrix display using organic EL elements.

The organic El display device manufactured by the above-described method is evaluated by connecting the driving circuit for driving the display device and by inputting signals along the timing chart shown in FIG. 11, which has been already explained in the section of the conventional example.

In the organic El display device manufactured by the above-described method, the number of defective pixels is zero and sound operation of the display device is confirmed without generating non-lighting pixel or cross-talk.

Comparative Example

In this film forming process of the electrode made of aluminum and the lithium, the deposition was made similarly with the first embodiment as shown above except that the deposition source 13 containing aluminum and the deposition source 14 containing lithium were placed below the center of substrate while both sources were separated by a distance 19 of 100 mm and at a depth 15 of 400 mm from the deposition surface of the substrate to the top surfaces of both deposition sources.

In the above deposition process, the incident angle of the deposition metal (aluminum and lithium) was 90 degrees at maximum and 77 degrees at minimum. Under such depositing conditions, the organic El display device was formed and evaluated by inputting signals along the timing chart shown in FIG. 11.

For the display devices in which the cathode 6 was formed in the incident angle range 22 of 77 to 85 degrees, it was confirmed that the number of defective pixels was zero. However, when the cathode 6 was formed in the range 22 of 85 to 90 degrees, more than ten defective pixels were formed, which cause non-lighting pixels and cross-talk.

The above results imply that, since the incident angle of the deposition alloy in the first embodiment is limited to less than 76 degrees, which is lower than the safe incident angle limit of 85 degrees, defective pixels in the display device according to the first embodiment can be eliminated.

As described above, the first embodiment of the present invention has been described in detail with reference to the attached drawings. However, it is noted that the practical constitution is not limited to the first embodiment, and variants thereof can be envisaged which do not exceed the scope of the present invention.

Second Embodiment

The mask 11, which is formed in the same shape as that of the first embodiment, and the substrate are disposed in the same manner as that of the first embodiment (positional relationship between the cathode patterning mask 11 and the substrate 16).

Figure 6:
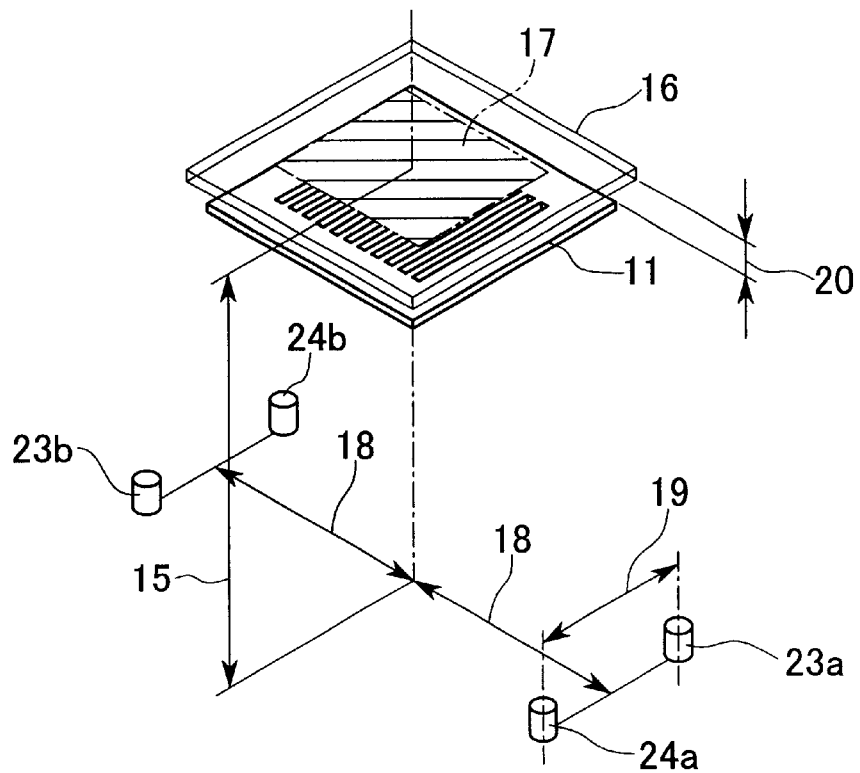
FIG. 6 is a schematic diagram showing an arrangement of the substrate and deposition sources in the vacuum deposition chamber in the organic EL display device manufacturing process according to the second, third and fourth embodiments of the present invention.

Magnesium and silver are used as the materials for forming the cathode 6 in the cathode forming process. As shown in FIG. 6, magnesium is filled into the resistance heating deposition source 23a and the resistance heating deposition source 23b, and silver is filled into the resistance heating deposition source 24a and the resistance heating deposition source 24b.

The resistance heating deposition source 23a and the resistance heating deposition source 24a are disposed in parallel with the ITO electrode pattern at a position separated from the substrate center by 190 mm, and these two deposition sources are disposed in the perpendicular direction to the ITO electrode pattern separated by a distance 19 (100 mm).

The resistance heating deposition source 23b and the resistance heating deposition source 24b are disposed at positions which are point symmetrical to the resistance heating deposition source 23a and the resistance heating deposition source 24a separated by a distance 18 (190 mm).

A line segment connecting between the resistance heating deposition source 23b and the resistance heating deposition source 24b is located in symmetry with the line segment connecting between the resistance heating deposition source 23a and the resistance heating deposition source 24a.

On the other hand, a line segment connecting between the resistance heating deposition source 23b and the resistance heating deposition source 24b is located symmetrically about the center line of the substrate in parallel with the cathode with the line segment connecting between the resistance heating deposition source 23a and the resistance heating deposition source 24a.

The height from apertures of all heat resistant deposition sources (23a, 23b, 24a, and 24b) to the deposition surface of the substrate 16 is determined to be 400 mm. In the above arrangement of deposition sources, the incident angle of the deposition material to the substrate 16 ranges from the minimum angle of 55 degrees to the maximum angle of 73 degrees.

The shape of the cathode patterning mask 11, and disposition of the substrate 16 and the mask 11 are determined in conformity with the first embodiment, and the electrode film is deposited in a thickness of 400 nm using a material made of magnesium and silver adjusted at a compositional ratio of 10:1.

The organic EL display device produced using the deposition method (cathode forming process) according to the second embodiment was tested by connecting it with the driving circuit of the organic EL display device and the results showed that the number of defective pixels was zero, no non-lighting pixels were found, and the operation was normal.

In addition, the present embodiment provides a display device in which each width of the cathode stripe is 0.45 mm and each space between the cathode stripes is 0.05 mm, which results in reducing the space by 50% in comparison with the first embodiment.

Third Embodiment

The same organic EL display device is made as that of the second embodiment excluding in the cathode forming process, as shown in FIG. 6, that the gap 20 between the cathode-patterning mask 11 and the substrate 16 is separated by 0.08 mm, and the display device is tested.

The incident angles of the deposition material to the substrate in the third embodiment are in a range of the minimum angle of 55 degrees to the maximum angle of 73 degrees.

The organic EL display device produced by the deposition method (cathode forming process) according to the third embodiment was evaluated by connecting to the driving circuit of the display device and the results showed that the number of defective pixels was zero, no non-lighting pixels were found, and the operation was normal.

In addition, the present embodiment provides a display device in which each width of the cathode stripe is 0.48 mm and each space between the cathode stripes is 0.02 mm, which results in reducing the space by 80% in comparison with the first embodiment.

Fourth Embodiment

The same organic EL display device is produced as that of the second embodiment excluding in the cathode forming process, as shown in FIG. 6, that the gap 20 between the cathode-patterning mask 11 and the substrate 16 is separated by 0.10 mm and the distance 18 is set as 150 mm, the display device is tested.

The incident angles of the deposition material to the substrate in the third embodiment are in a range of the minimum angle of 59 degrees to the maximum angle of 79 degrees.

The organic EL display device produced by the deposition method (cathode forming process) according to the fourth embodiment was evaluated by connecting it to the driving circuit of the display device, obtaining the results that the number of defective pixels was zero, no non-lighting pixels were found, and the operation was normal.

In addition, the present embodiment provides a display device in which each width of the cathode stripe is 0.48 mm and each space between the cathode stripes is 0.02 mm, which results in reducing the space by 80% in comparison with the first embodiment.

Fifth Embodiment

Figure 7:
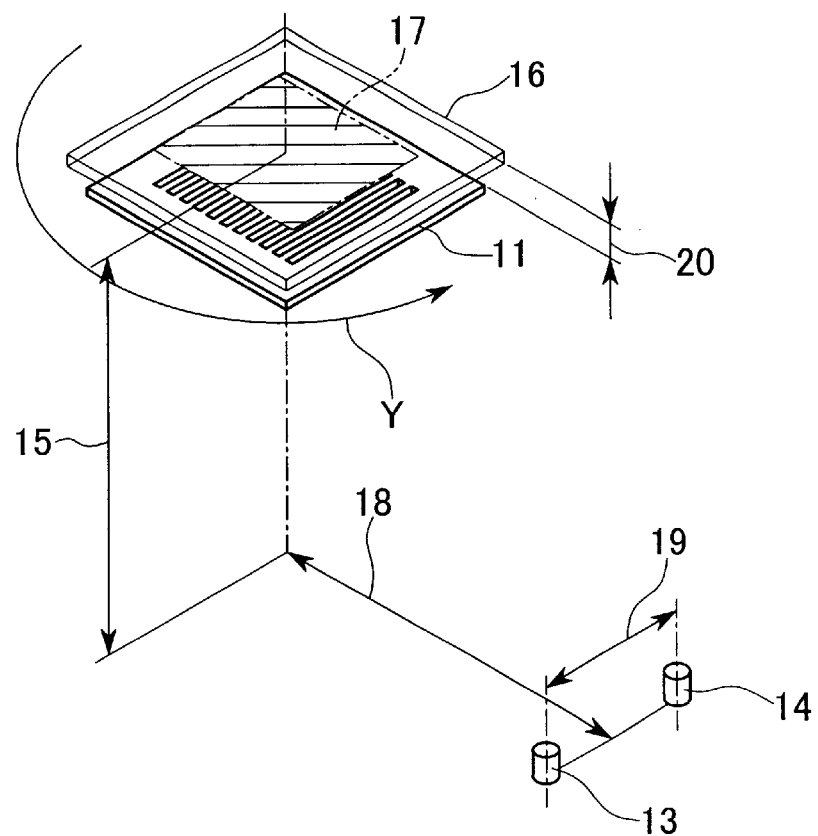
FIG. 7 is a schematic diagram showing an arrangement of the substrate and deposition sources in the vacuum deposition chamber in the organic EL display device manufacturing process according to the fifth embodiment of the present invention.

The same organic EL display device is produced as that of the first embodiment by the same arrangement and by the same procedures before forming the cathode film excluding in the cathode forming process, as shown in FIG. 7, that the gap 20 between the cathode-patterning mask 11 and the substrate 16 is separated by 0.05 mm.

The cathode electrode 6 is formed first until the thickness reaches 200 nm while adjusting the deposition ratio of magnesium and lithium at 10:1, and then a main shutter disposed between the substrate and the resistant heating deposition sources 13 and 14 is closed.

Thereby, the deposition material from the resistant heating deposition sources 13 and 14 is blocked by the shutter and does not arrive at the substrate.

While the main shutter is closed, and while the relative positions of the substrate 16 and the mask 11 are fixed, the substrate and mask 11 are rotated horizontally in 180 degrees, for example, in Y direction in FIG. 7.

Subsequently, the main shutter is opened such that the depositing material from the resistance heating deposition sources 13 and 14 reaches the surface of the substrate 16, and the deposition of the cathode 6 metal is continued until the thickness reaches 200 nm.

The organic PL display device is obtained by the above deposition method (cathode forming process) according to the fifth embodiment.

In the cathode forming process according to the fifth embodiment, the incident angle of the deposition material to the substrate 16 is in a range of the minimum angle of 55 degrees to the maximum angle of 67 degrees.

The test results of the above display device according to the fifth embodiment showed that the number of defective pixels was zero, non-lighting pixels and cross-talk was not generated, and the operation was normal.

In addition, the present embodiment provides a display device in which each width of the cathode stripe is 0.463 mm and each space between the cathode stripes is 0.037 mm, which results in reducing the space by 62.5% in comparison with the first embodiment.

Sixth Embodiment

Figure 8:
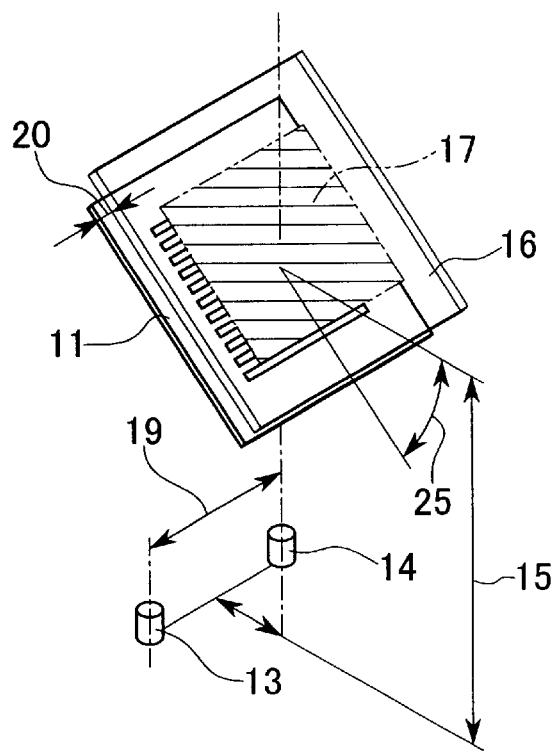
FIG. 8 is a schematic diagram showing an arrangement of the substrate and deposition sources in the vacuum deposition chamber in the organic EL display device manufacturing process according to the sixth embodiment of the present invention.
Figure 9:
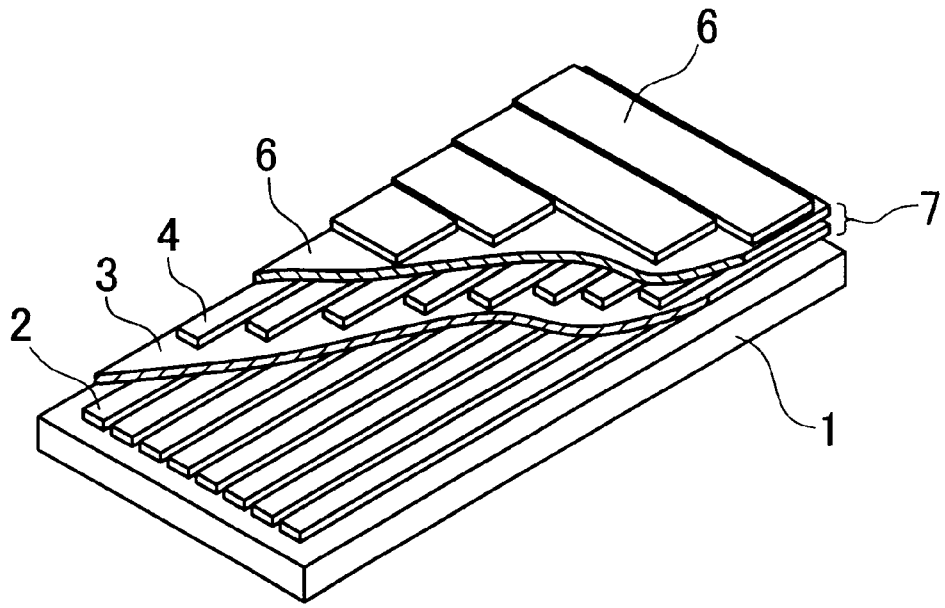
FIG. 9 is a schematic perspective view of a simple matrix display using organic EL elements.
Figure 10:
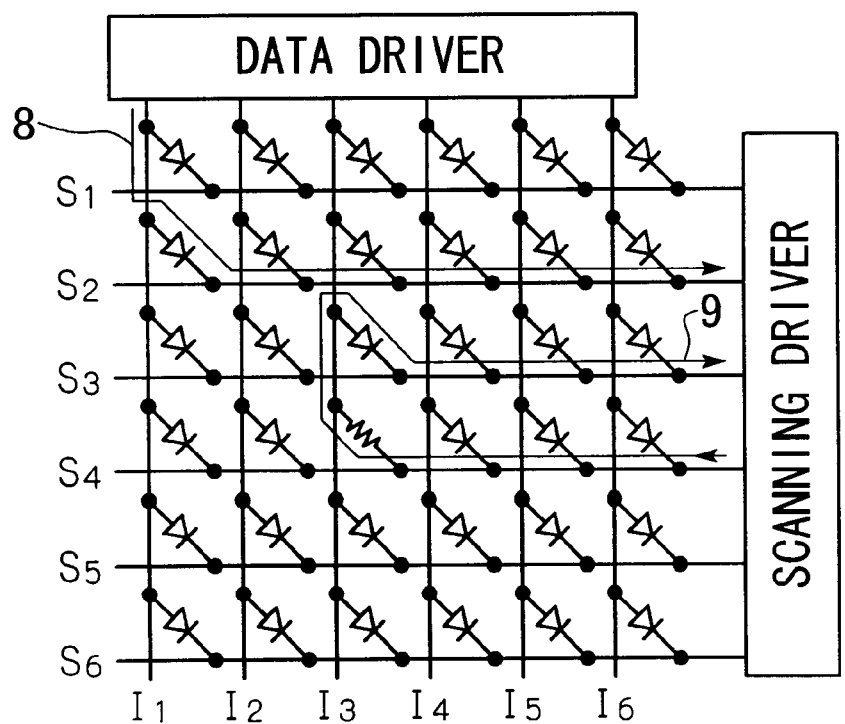
FIG. 10 is a block diagram showing the structure of a simple matrix display constituted by 6 pixels×6 pixels of the organic EL display elements.

In the cathode forming process, as shown in FIG. 8, the substrate, the metal mask, and the deposition sources are disposed by setting the distance 18 at 150 mm and an inclination 25 at 30 degrees, while maintaining the gap between the substrate 16 and the mask 11 at 0.03 mm.

The height 15 from the apertures of the resistant heat deposition sources 13 and 14 to the center of the substrate 16 is set at 400 mm.

The organic EL device is produced by the same method as the first embodiment except for the above-described setting conditions. The test results of the organic EL display device according to the sixth embodiment showed that the number of defective pixels was zero, non-lighting pixels and cross-talk were not generated, and the operation was normal.

The incident angle of the deposition material on the substrate can be optionally determined in some extent irrespective of the size of the deposition reactor by using the cathode forming method according to the sixth embodiment.

Seventh Embodiment

After forming the organic film layer (the organic film 7), a film made of lithium fluoride (inorganic film) is formed on the organic film layer 7 in a uniform thickness of 0.5 nm by a vacuum deposition method such as resistance heating or electron beam deposition methods or by a sputtering method.

On the surface of the lithium fluoride film, an aluminum film is formed for forming the cathode.

That is, aluminum is filled in resistance heating deposition sources 23a, 23b, 24a, and 24b, as shown in FIG. 6, and deposition of the cathode 6 was carried out.

The distance between these resistance heating deposition sources 23a, 23b, 24a, and 24b and the substrate surface 16 is set to 400 mm.

In the seventh embodiment, the incident angle of the deposition material to the substrate 16 is in a range from the minimum angle of 55 degrees and the maximum angle of 73 degrees.

The shape of the cathode patterning mask 11 with respect to the cathode 6, the setting methods of the mask 11 and the substrate 16 (including the relative position of the mask 11 and the substrate 16) are determined in conformity with the first embodiment.

Subsequently, the cathode 6 is deposited onto the lithium fluoride film in a thickness of 400 nm.

The test results of the organic EL display device produced according to the seventh embodiment showed that the number of defective pixels was zero, non-lighting pixels and cross-talk were not generated, and the operation was normal.

In addition, the present embodiment provides a display device in which each width of the cathode stripe is 0.45 mm and each space between the cathode stripes is 0.05 mm, which results in reducing the space by 50% in comparison with the first embodiment.

What is claimed is:

1. An organic EL display device manufacturing method comprising:

forming a first stripe-shaped electrode pattern on a substrate surface;

forming a plurality of layers including an organic layer on the substrate surface including said first electrode pattern; and forming a second stripe-shaped electrode pattern on said first electrode pattern in the orthogonal direction to said first electrode pattern by disposing a mask between a plurality of deposition sources of the electrode material and the substrate separated at a predetermined distance from said substrate and by supplying a deposition material onto the surface of said plurality of layers through a plurality of slits of the mask, wherein said plurality of deposition sources are provided at a position such that the deposition material is deposited onto the substrate surface at a predetermined incident angle.

2. An organic EL display device manufacturing method according to claim 1, wherein a second deposition source is disposed at a position on a projected line at the position of said first deposition source in parallel with stripes of said second stripe-like electrode and which has the same distance as the first deposition source from the vertical line passing through the center of the substrate.

3. An organic EL display device manufacturing method according to claim 1, further comprising rotating said substrate and said mask by 180 degrees about the vertical axis passing the center of the substrate, while maintaining a positional relationship between the substrate and the mask and forming said electrode pattern by supplying a deposition material for the electrode through said plurality of slits of said mask.

4. An organic EL display device manufacturing method according to claim 1, wherein said incident angle of said deposition material onto the substrate is controlled by controlling a distance between the substrate and a plane which is parallel to the substrate, and which includes apertures of said deposition sources, and a distance between a projected point of the substrate center on said plane including apertures of said deposition sources and centers of said deposition sources.

5. An organic EL display device manufacturing method according to claim 1, wherein said substrate is disposed with a predetermined inclination angle from the horizontal plane, and said mask is disposed parallel to the substrate separated at a predetermined distance from said substrate.

6. An organic EL display device manufacturing method comprising:

forming a first stripe-shaped electrode pattern on a substrate surface;

forming a plurality of layers including an organic layer on the substrate surface including said first electrode pattern; and forming a second stripe-shaped electrode pattern on said first electrode pattern in the orthogonal direction to said first electrode pattern by disposing a mask between a plurality of deposition sources of the electrode material and the substrate separated at a predetermined distance from said substrate and by supplying a deposition material onto the surface of said plurality of layers through a plurality of slits of the mask, wherein said plurality of deposition sources are provided at a position such that the deposition material is deposited onto the substrate surface at a predetermined incident angle set in a range of 30 to 85 degrees.

7. An organic EL display device manufacturing method comprising:

forming a first electrode pattern on a substrate surface;

forming a plurality of layers including an organic layer on the substrate surface including said first electrode pattern; and forming a second electrode pattern on said first electrode pattern by disposing a mask between a plurality of deposition sources of the electrode material and the substrate separated at a predetermined distance from said substrate and by supplying at least one type of deposition material onto the surface of said plurality of layers through a plurality of slits of the mask at a predetermined oblique incident angle, wherein a plurality of spaces between the first electrode pattern and the second electrode pattern is thinner than a width of either of the electrode patterns.

8. An organic EL display device manufacturing method according to claim 7, wherein said predetermined oblique incident angle is set in a range of 30 to 85 degrees.

9. An organic EL display device manufacturing method according to claim 7, wherein said second electrode pattern is substantially orthogonal to said first electrode pattern.

10. An organic PL display device manufacturing method according to claim 7, wherein at least one type of said deposition material is supplied, simultaneously or sequentially, with a second type of deposition material onto the surface of said plurality of layers through said plurality of slits of the mask at a predetermined oblique incident angle.

11. An organic EL display device manufacturing method according to claim 7, wherein, an opening area of the organic EL display device is increased and a pitch of the organic EL display device is narrowed so as to make a non-lighting space narrower among a plurality of pixels.

* * * * *